United States Patent
Iwasaki

(10) Patent No.: US 9,294,846 B2
(45) Date of Patent: Mar. 22, 2016

(54) PIEZOELECTRIC VIBRATION ELEMENT, AND PIEZOELECTRIC VIBRATION DEVICE AND PORTABLE TERMINAL USING PIEZOELECTRIC VIBRATION ELEMENT

(71) Applicant: KYOCERA Corporation, Kyoto-shi, Kyoto (JP)

(72) Inventor: Satoru Iwasaki, Kirishima (JP)

(73) Assignee: KYOCERA CORPORATION, Kyoto-Shi, Kyoto (JP)

( * ) Notice: Subject to any disclaimer, the term of this patent is extended or adjusted under 35 U.S.C. 154(b) by 0 days.

(21) Appl. No.: 14/399,340

(22) PCT Filed: Mar. 27, 2013

(86) PCT No.: PCT/JP2013/058979
§ 371 (c)(1),
(2) Date: Nov. 6, 2014

(87) PCT Pub. No.: WO2013/168478
PCT Pub. Date: Nov. 14, 2013

(65) Prior Publication Data
US 2015/0131821 A1    May 14, 2015

(30) Foreign Application Priority Data
May 7, 2012    (JP) .................................. 2012-105995

(51) Int. Cl.
*H04R 1/02*    (2006.01)
*H04R 17/00*    (2006.01)
(Continued)

(52) U.S. Cl.
CPC ............ *H04R 17/00* (2013.01); *H01L 41/0471* (2013.01); *H01L 41/0472* (2013.01); *H01L 41/0973* (2013.01); *H04R 7/04* (2013.01); *H04R 2499/11* (2013.01)

(58) Field of Classification Search
CPC ................ H04R 17/00; H04R 2449/11; H04R 2499/15; H04R 17/005; H04R 7/04; B06B 1/0603
USPC .......... 381/190, 191, 163; 310/330, 332, 328, 310/331, 366, 367
See application file for complete search history.

(56) References Cited

U.S. PATENT DOCUMENTS

2006/0158068 A1* 7/2006 Shimizu et al. ................ 310/358
2012/0025923 A1    2/2012 Takizawa
(Continued)

FOREIGN PATENT DOCUMENTS

JP    06-312505 A    11/1994
JP    2001-016692 A    1/2001
(Continued)

OTHER PUBLICATIONS

International Search Report (Form PCT/ISA/210) dated May 7, 2013 issued for PCT/JP2013/058979.
(Continued)

*Primary Examiner* — Sunita Joshi
(74) *Attorney, Agent, or Firm* — Volpe and Koenig, P.C.

(57) ABSTRACT

A piezoelectric vibration element which includes at least a plurality of electrodes and a plurality of piezoelectric layers alternately disposed in a first direction, and performs bending vibration in the first direction so as to change amplitude in a second direction vertical to the first direction by inputting an electric signal, and in which a center of a facing portion in the second direction is provided at a different position from a center of the piezoelectric vibration element in the second direction, the facing portion including a portion in which one of the piezoelectric layers interposed between the electrodes that are disposed so as to be adjacently opposed to each other, and a piezoelectric vibration device and a portable terminal using the piezoelectric vibration element are provided.

12 Claims, 10 Drawing Sheets

(51) Int. Cl.
   *H01L 41/047* (2006.01)
   *H01L 41/09* (2006.01)
   *H04R 25/00* (2006.01)
   *H04R 7/04* (2006.01)

(56) References Cited

U.S. PATENT DOCUMENTS

| | | | |
|---|---|---|---|
| 2012/0140969 A1* | 6/2012 | Fujise et al. | 381/333 |
| 2013/0194049 A1 | 8/2013 | Takizawa | |

FOREIGN PATENT DOCUMENTS

| | | | | |
|---|---|---|---|---|
| JP | 2006-238072 | A | 9/2006 | |
| JP | 2006-319156 | A | 11/2006 | |
| JP | 2010-153441 | A | 7/2010 | |
| JP | 2010-278178 | A | 9/2010 | |
| JP | 5409772 | B2 * | 2/2014 | |
| TW | 201214963 | A1 | 4/2012 | |
| WO | WO 2010/110291 | A | 9/2010 | |
| WO | WO 2010110291 | A1 * | 9/2010 | F02M 51/0603 |

OTHER PUBLICATIONS

Taiwanese Office Action with English concise explanation, Taiwanese Patent Application No. 102115543, Apr. 10, 2015, 7 pgs.
Taiwanese Office Action with English concise explanation, Taiwanese Patent Application No. 102115543, Dec. 26, 2014, 6 pgs.
Japanese Decision of Refusal with English concise explanation, Japanese Patent Application No. 2014-514402, Oct. 6, 2015, 5 pgs.

* cited by examiner

PIEZOELECTRIC VIBRATION ELEMENT, AND PIEZOELECTRIC VIBRATION DEVICE AND PORTABLE TERMINAL USING PIEZOELECTRIC VIBRATION ELEMENT

TECHNICAL FIELD

The present invention relates to a piezoelectric vibration element, and a piezoelectric vibration device and a portable terminal using the piezoelectric vibration element.

BACKGROUND ART

In recent years, a piezoelectric vibration device is known in which a bimorph type plate-shaped piezoelectric element is fixed to a diaphragm and the diaphragm is vibrated by vibrating the bimorph type piezoelectric element (for example, refer to PTL 1).

CITATION LIST

Patent Literature

PTL 1: Japanese Unexamined Patent Application Publication No. 2006-238072

SUMMARY OF INVENTION

Technical Problem

The amplitude of the diaphragm changes rapid at a specific frequency in the above-mentioned piezoelectric vibration device in the related art, and there is a concern that distortion occurs in transmitted sound information when the sound information is transmitted by vibration of the diaphragm.

The present invention has been made in view of such a concern in the related art, and an object of the invention is to provide a piezoelectric vibration element realizing a vibration device in which rapid amplitude change at a specific frequency is reduced, and a piezoelectric vibration device and a portable terminal using the piezoelectric vibration element.

Solution to Problem

A piezoelectric vibration element according to the invention includes at least a plurality of electrodes and a plurality of piezoelectric layers alternately disposed in a first direction, and performs bending vibration in the first direction so as to change amplitude in a second direction vertical to the first direction by inputting of an electric signal. In the piezoelectric vibration element, a center of a facing portion in the second direction is provided at a different position from a center of the piezoelectric vibration element in the second direction, the facing portion is a portion in which the electrodes that are disposed adjacent to each other in the first direction and have different electric potentials face each other by having each of the piezoelectric layers therebetween.

A piezoelectric vibration device according to the invention includes at least the piezoelectric vibration element and a diaphragm of which one main surface is bonded to a surface of the piezoelectric vibration element on one side of the first direction. In the piezoelectric vibration device, the center of the facing portion in the second direction is provided at a different position from a center of the diaphragm in the second direction.

A portable terminal according to the invention includes at least a housing, the piezoelectric vibration device which is provided in the housing, and an electronic circuit which generates an electric signal to be received by the piezoelectric vibration element.

Advantageous Effects of Invention

According to the piezoelectric vibration element of the invention, it is possible to obtain a piezoelectric vibration element for realizing a vibrating device in which rapid amplitude change at a specific frequency is reduced. According to the piezoelectric vibration device of the invention, it is possible to obtain a piezoelectric vibration device in which rapid amplitude change at a specific frequency is reduced. According to the portable terminal of the invention, it is possible to obtain the portable terminal capable of transmitting sound information with reduced distortion.

DESCRIPTION OF EMBODIMENTS

Hereinafter, a piezoelectric vibration element, and a piezoelectric vibration device and a portable terminal using the piezoelectric vibration element according to the invention will be described in detail with reference to the accompanying drawings.

First Example According to an Embodiment

Figure 1:
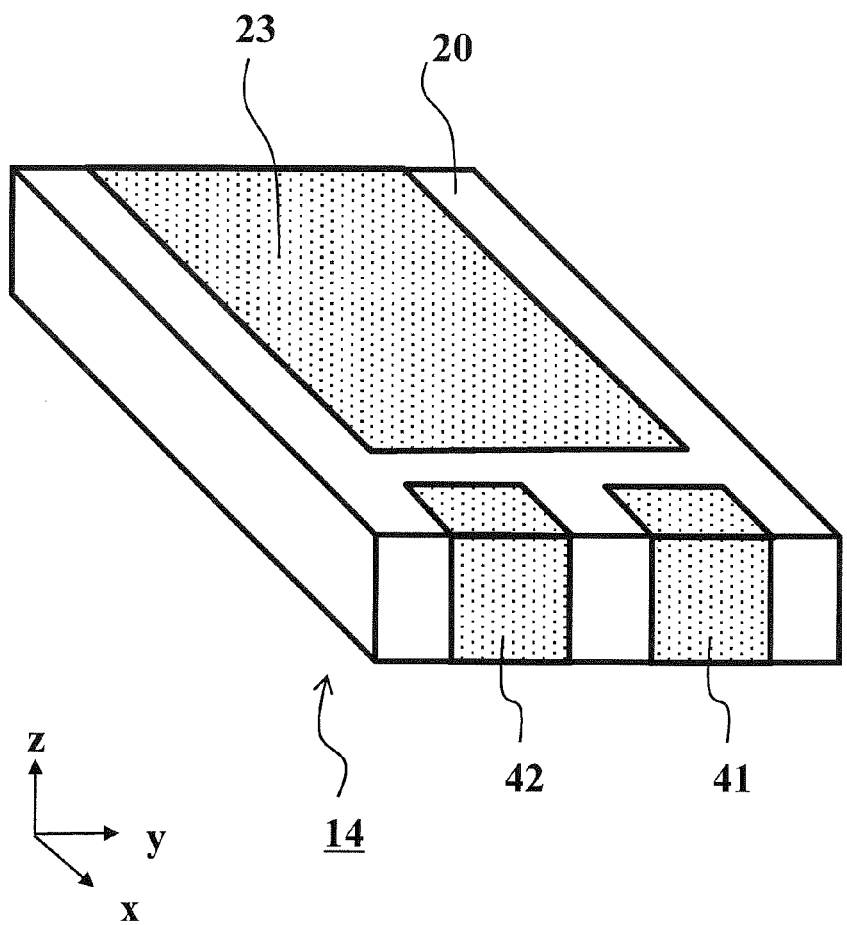
FIG. 1 is a perspective view schematically illustrating a piezoelectric vibration element as a first example according to an embodiment of the invention.
Figure 2A:
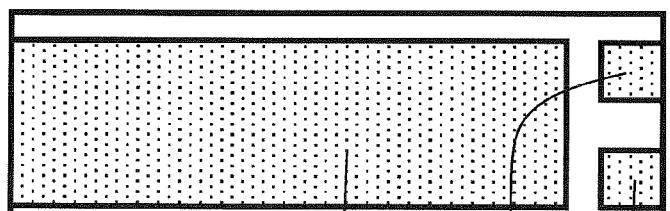
FIGS. 2($a$) to 2($e$) are plan views for describing the structure of the piezoelectric vibration element shown in FIG. 1.
Figure 2B:
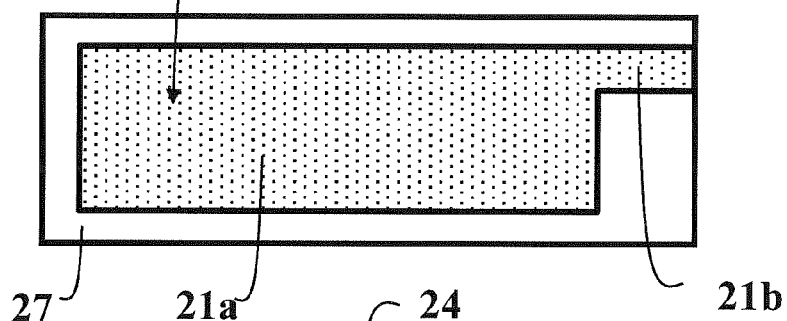
Figure 2C:
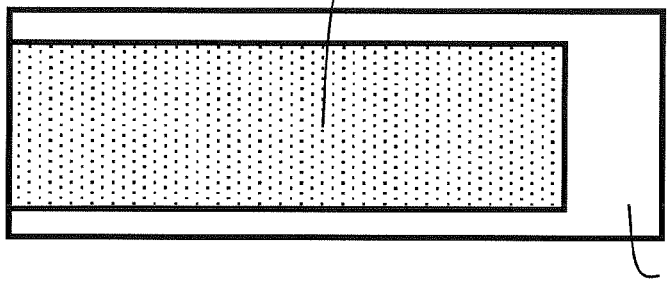
Figure 2D:
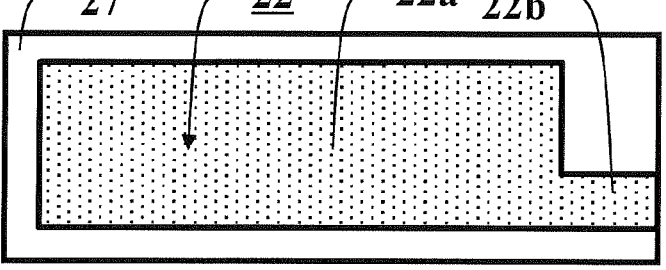
Figure 2E:
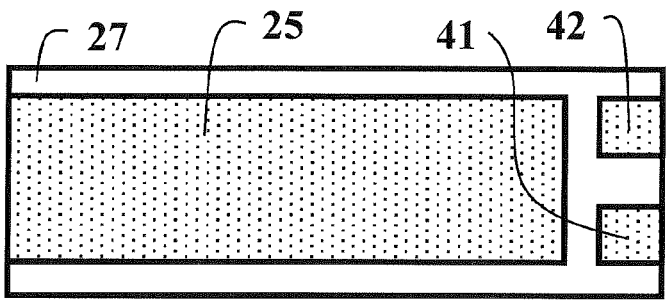
Figure 3:
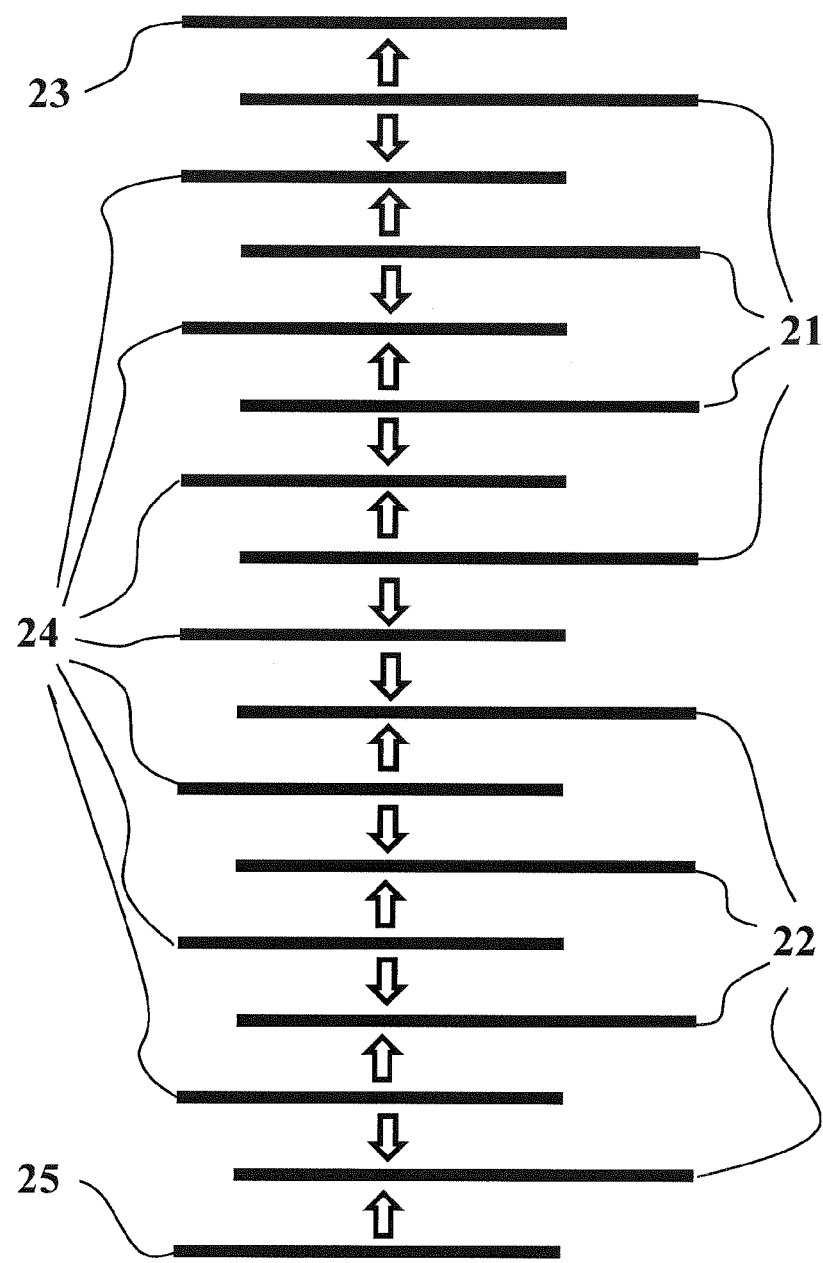
FIG. 3 is a view for describing the structure of the piezoelectric vibration element shown in FIG. 1.

FIG. 1 is a perspective view schematically illustrating a piezoelectric vibration element 14 as a first example according to an embodiment of the invention. FIGS. 2($a$) to 2($e$) are plan views schematically illustrating the shape of electrodes 21 to 25 included in the piezoelectric vibration element 14. FIGS. 2($a$) to 2($d$) show a state when viewed from one side of a first direction (+z direction side in the drawings). FIG. 2($e$) shows a state when viewed from the other side of the first direction (−z direction side in the drawings). FIG. 3 schematically shows position relation between the electrodes 21 to 25 in the first direction (z axis direction in the drawing) and a polarization state of piezoelectric layers 27 disposed between the electrodes 21 to 25. A layer-laminated body 20, first to third terminal electrodes and piezoelectric layers 27 are not illustrated in FIG. 3.

The piezoelectric vibration element 14 in this example has a rectangular parallelepiped shape in which a thickness direction is the first direction (z axis direction in the drawing), a longitudinal direction is a second direction vertical to the first direction (x axis direction in the drawing), and a width direction is the y axis direction in the drawing that is vertical to the first direction and the second direction. The piezoelectric vibration element 14 includes the layer-laminated body 20, the first terminal electrode 41, the second terminal electrode 42, and the third terminal electrode (not illustrated).

The first terminal electrode 41 and the second terminal electrode 42 are disposed on an end surface of the layer-laminated body 20 in one side of the second direction (+x direction side in the drawing) so as to straddle both end surfaces of the layer-laminated body 20 in the first direction (z axis direction in the drawing). The third terminal electrode (not illustrated) is disposed on an end surface of the layer-laminated body 20 in the other side of the second direction (−x direction side in the drawing).

The piezoelectric layers 27 which are polarized in the first direction (z axis direction in the drawing) and the electrodes 21 to 25 with a flat shape are alternately disposed in the first direction in the layer-laminated body 20. The electrode 23 is disposed on a surface of one side of the layer-laminated body 20 in the first direction (+z direction side in the drawing). The electrode 25 is disposed on a surface of the layer-laminated body 20 in the other side of the first direction (−z direction side in the drawing). Each of the electrodes 21, 22 and 24 is disposed in plural in the layer-laminated body 20. The electrode 21 or 22 and the electrode 23, 24 or 25 are alternately disposed in the first direction (z axis direction in the drawing). The electrode 23 or 24 and the electrode 21 are alternately disposed in one side of the first direction (+z direction side in the drawing), and the electrode 24 or 25 and the electrode 22 are alternately disposed in the other side of the first direction (−z direction side in the drawing).

The electrode 21 has a structure in which a rectangular main body portion 21a is formed at a distance from a side surface of the layer-laminated body 20, and one end of the main body portion 21a is connected with one end of a rectangular pulling-out portion 21b. The other end of the pulling-out portion 21b is connected to the first terminal electrode 41. The electrode 22 has a structure in which a rectangular main body portion 22a is formed at a distance from a side surface of the layer-laminated body 20, and one end of the main body portion 22a is connected with one end of a rectangular pulling-out portion 22b. The other end of the pulling-out portion 22b is connected to the second terminal electrode 42. The electrodes 23, 24 and 25 respectively have a rectangular shape in which only one ends thereof is exposed to the side surface of the layer-laminated body 20 in a longitudinal direction of the electrodes. The third terminal electrode (not illustrated) is connected with the one ends of the electrodes 23, 24 and 25 in the longitudinal direction.

The piezoelectric layers 27 are disposed between the electrodes 21 to 25, and are polarized in a direction indicated by arrows in FIG. 3. That is, polarization is performed in a direction from the electrode 21 to the electrodes 23 and 24 in one side of the first direction (+z direction side in the drawing), and polarization is performed in a direction from the electrodes 24 and 25 to the electrode 22 in the other side of the first direction (−z direction side in the drawing). When the piezoelectric vibration element 14 is vibrated, for example, an alternating current voltage is applied to the electrodes 21 to 25 in such a manner that the electrodes 21 and 22 have the same electric potential, the electrodes 23, 24 and 25 have the same electric potential, and potential difference between the electrodes 21 and 22 and the electrodes 23, 24 and 25 is generated. With this, a polarization direction with respect to an applied electric field direction at a certain moment is inverted to one side and the other side of the first direction (z axis direction in the drawing) in the piezoelectric vibration element 14.

The other side of the first direction (−z direction side of the drawing) is reduced in the second direction when an electric signal is applied at a certain moment, and the one side of the first direction (+z direction side of the drawing) is extended in the second direction (x axis direction in the drawing). With this, the piezoelectric vibration element 14 performs bending vibration in the first direction by inputting an electric signal such that the amplitude changes along the second direction. In this manner, the piezoelectric vibration element 14 is formed with a piezoelectric body having a bimorph structure (bimorph type piezoelectric element).

Figure 4:
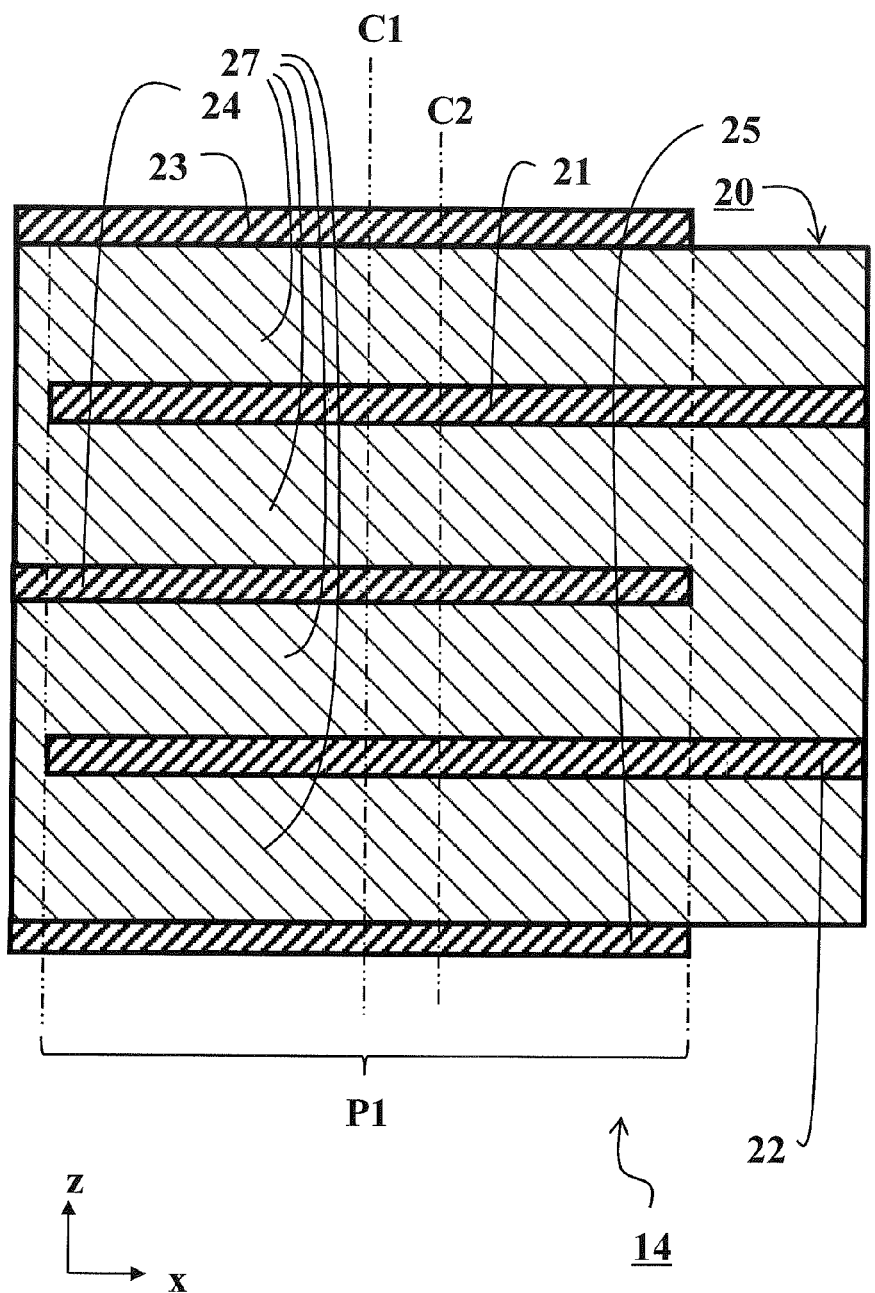
FIG. 4 is a cross-sectional view for describing the structure of the piezoelectric vibration element shown in FIG. 1.

FIG. 4 is a schematic cross-sectional view for describing the structure of the piezoelectric vibration element shown in FIG. 1. The first to third terminal electrodes are not illustrated and only one of the electrodes 21, 22 and 24 is illustrated for convenient illustration in FIG. 4.

In the piezoelectric vibration element 14 according to this example, a facing portion P1 is portions of the electrodes, which face each other with the piezoelectric layer 27 interposed therebetween, with respect to the electrodes which are disposed to be adjacent to each other and connected to different electric potentials from each other in the first direction (z axis direction in the drawing), and a center C1 of the facing portion P1 in the second direction (x axis direction in the drawing) is provided at a different position from a center C2 of the piezoelectric vibration element 14 in the second direction. With this, it is possible to distribute a standing wave which is generated in the second direction of the piezoelectric vibration element 14 when an electric signal is input, and then the piezoelectric vibration element 14 performs bending vibration in the first direction (z axis direction in the drawing) such that amplitude changes along the second direction. For example, it is possible to reduce rapid amplitude change at a specific frequency when the piezoelectric vibration device is configured such that the surface of the piezoelectric vibration element 14 in the first direction is bonded to a main surface of the diaphragm and the diaphragm is vibrated by vibration of the piezoelectric vibration element 14. That is, it is possible to realize the piezoelectric vibration device having a vibration characteristic in which rapid change in amplitude according to change in frequency is reduced. The piezoelectric vibration element 14 in this example has an elongated shape in the second direction (x axis direction in the drawing), and thus it is possible to realize the piezoelectric vibration device having a vibration characteristic in which rapid change in amplitude according to change in frequency is further reduced.

Furthermore, when the center C1 of the facing portion P1 in the second direction is far from the center C2 of the piezoelectric vibration element 14 in the second direction, the effect of reducing the rapid amplitude change at a specific frequency is improved, but intensity of the vibration generated overall decreases. Accordingly, the distance is appropriately set according to a desired characteristic between the center C1 of the facing portion P1 in the second direction and the center C2 of the piezoelectric vibration element 14 in the second direction.

When the center C1 of the facing portion P1 of a pair of electrodes in the x axis direction of the drawing changes in the y axis direction of the drawing in one piezoelectric layer 27, the pair of electrodes which face each other with the piezoelectric layer 27 therebetween and are connected to different electric potentials from each other, the positions of C1 in the y axis direction of the drawing in the piezoelectric layer 27 may be set to the average of the positions of C1 in the y axis direction of the drawing.

The positions of the center C1 in respective piezoelectric layers 27 is averaged over all the piezoelectric layers 27, and the center C1 may be disposed at the averaged position different from the center C2 in the x axis direction of the piezoelectric vibration element 14 in the drawing in a case where a piezoelectric layer 27 is present in which the center C1 of the facing portion P1 in the x axis direction of the drawing is disposed differently from that in other piezoelectric layers. In this case, it is required to obtain the average while weighting using the area of each facing portion P1. For example, it is assumed that distances are respectively set to x1, x2, x3 and x4 from one end of the piezoelectric vibration element 14 in the second direction (x axis direction in the drawing) to the centers C1 of the respective facing portions P1, and the areas of the respective facing portions P1 are set to s1, s2, s3 and s4 in four piezoelectric layers 27. A distance x5 from one end of the piezoelectric vibration element 14 in the second direction becomes $x5=(x1s1+x2s2+x3s3+x4s4)/(s1+s2+s3+s4)$, the average position of the center C1 of the facing portions P1 is set to a position corresponding to the distance x5, and then the average position of the center C1 may be different from the position of the center C2 of the piezoelectric vibration element 14.

The layer-laminated body 20 may be, for example, approximately 18 mm to 28 mm in length, approximately 1 mm to 6 mm in width, and approximately 0.2 mm to 1.0 mm in thickness in the piezoelectric vibration element 14 of this example. The electrodes 21 to 25 may be, for example, approximately 17 mm to 25 mm in length, and approximately 0.5 mm to 1.5 mm in width.

The piezoelectric layer 27 forming the layer-laminated body 20 may be formed by suitably using, for example, lead titanate, lead titanate zirconate, non-lead-based piezoelectric material such as Bi-layered compound, tungsten-bronze structured compound, but may also be formed by using other piezoelectric materials. One piezoelectric layer 27 may be set, for example, to 0.01 mm to 0.1 mm in thickness. The electrodes 21, 22 and 24 are formed by suitably using a material containing a ceramic component or a glass component, in addition to a metal component such as silver, silver-palladium alloy, but may also be formed by using known metal materials. The electrodes 23 and 25, and the first to third terminal electrodes preferably contain a silver-formed metal component and a glass component, but may contain metal other than silver.

This piezoelectric vibration element 14 may be manufactured, for example, in the following manner. First, binder, dispersant, plasticizer, and solvent are added to piezoelectric material powders to be continuously mixed, and then slurry is manufactured. The obtained slurry is formed to be a sheet shape, and a green sheet is manufactured. Next, conductor paste is printed to the green sheet, and an electrode pattern which will be the electrodes 21, 22 and 24 is formed. The green sheet with this electrode pattern is laminated and a press device presses the laminated green sheet to manufacture a layer-laminated molding body. Then, degreasing and firing are performed, and cutting in a predetermined dimension is performed to obtain the layer-laminated body. Next, conductor paste is printed to form the electrodes 23 and 25, the first terminal electrode 41, the second terminal electrode 42, and the third terminal electrode (not illustrated), the printed conductor paste is baked at a predetermined temperature. After this, a direct current voltage is applied through the first to third terminal electrodes and polarization of the piezoelectric layer 27 is performed. In this manner, the piezoelectric vibration element 14 can be obtained.

In addition, a protection layer may also be provided which is formed of a piezoelectric material and the like, for example, in a case where problems occur when the electrodes are exposed to an end surface of the layer-laminated body 20 in the first direction (z axis direction in the drawing). In this case, it is preferable that the protection layer be sufficiently thin in thickness.

Second Example According to the Embodiment

Figure 5:
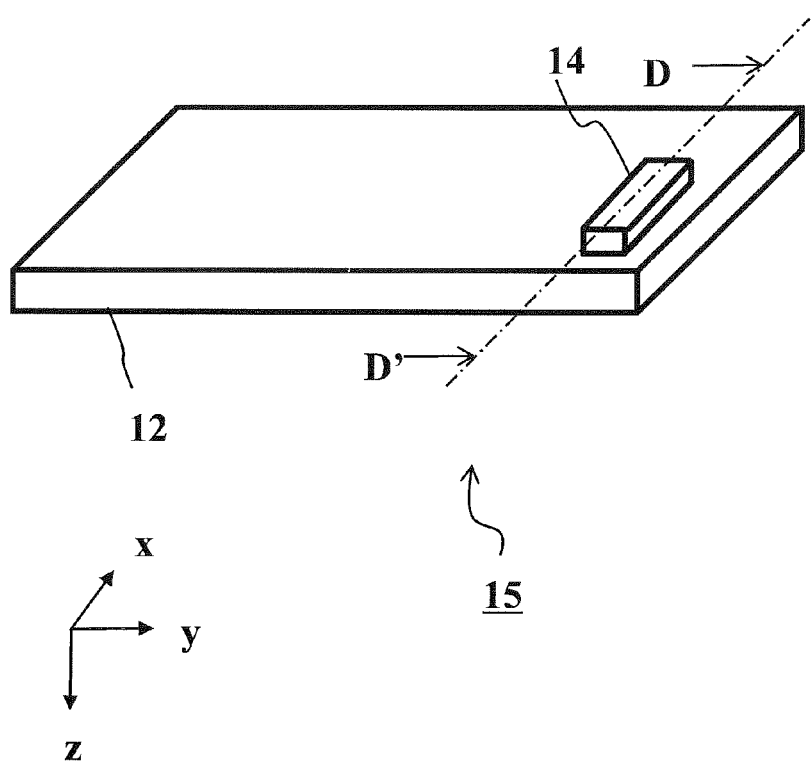
FIG. 5 is a perspective view schematically illustrating a piezoelectric vibration device as a second example according to an embodiment of the invention.
Figure 6:
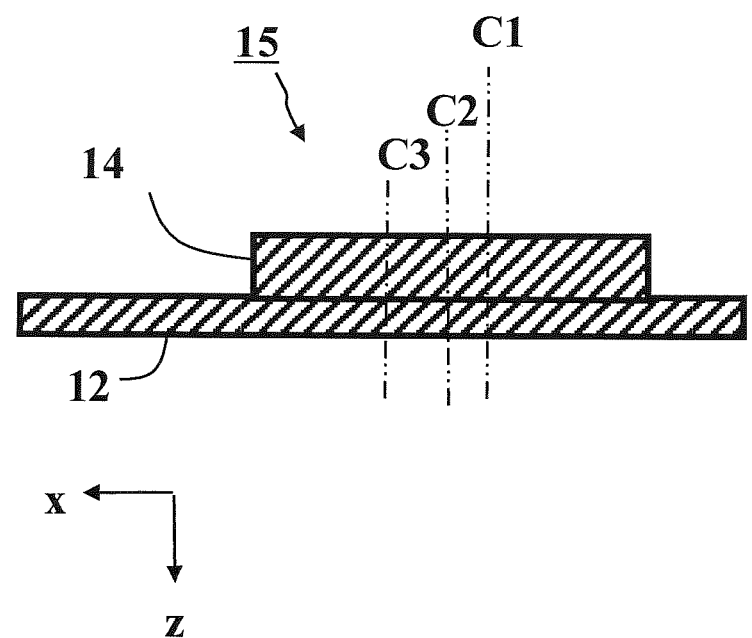
FIG. 6 is a cross-sectional view taken along line D-D' in FIG. 5.

FIG. 5 is a perspective view schematically illustrating a piezoelectric vibration device 15 as a second example according to the embodiment of the invention. FIG. 6 is a cross-sectional view taken along line D-D' in FIG. 5. For convenience of illustration, a detailed structure of the piezoelectric vibration element 14 is not illustrated in FIGS. 5 and 6. This example will be described below focusing on the difference from the above-described first example according to the embodiment, the same components are denoted by the same reference signs, and repetitive description thereof will be omitted. The piezoelectric vibration device 15 of this example includes the piezoelectric vibration element 14 of the first example according to the above-described embodiment, and a diaphragm 12.

The diaphragm 12 has a rectangular thin plate shape, and one main surface of the diaphragm 12 (main surface on the −z direction side in the drawing) is bonded to a surface of the piezoelectric vibration element 14 in one side of the first direction (+z direction side in the drawing). The piezoelectric vibration element 14 and the diaphragm 12 are bonded so as to match a longitudinal direction of the piezoelectric vibration element 14 with a width direction of the diaphragm 12. For example, various bonding members such as adhesive and a double-sided adhesive tape may be used as a bonding member for bonding the piezoelectric vibration element 14 and the diaphragm 12. The diaphragm 12 may be formed by using various known materials. The diaphragm 12 may be formed by suitably using materials, for example, having large rigidity and elasticity such as acryl resin or glass. The diaphragm 12 is set to, for example, approximately 0.4 mm to 1.5 mm in thickness. The piezoelectric vibration device 15 having such a configuration according to this example serves as a piezoelectric vibration device in which an electric signal is applied, and the piezoelectric vibration element 14 performs bending vibration to allow the diaphragm 12 to vibrate.

The center C1 of the facing portion P1 in the second direction (x axis direction in the drawing) is disposed at a different position from a center C3 of the diaphragm 12 in the second direction, the facing portion in which the electrodes face each other with a piezoelectric layer 27 interposed between the electrodes, which are disposed to be adjacent to each other and are connected to different electric potentials in the piezoelectric vibration element 14, in the case of the piezoelectric vibration device 15 according to this example. With this, it is possible to distribute the standing wave which is generated in the second direction of the diaphragm 12, and thus to reduce rapid amplitude change at a specific frequency in the vibration of the diaphragm. That is, according to the piezoelectric vibration device 15 of this example, it is possible to obtain the piezoelectric vibration device having a vibration characteristic in which rapid change in amplitude according to change in frequency is reduced.

Furthermore, the center C1 of the facing portion P1 in the second direction (x axis direction in the drawing), the center C2 of the piezoelectric vibration element 14 in the second direction, and the center C3 of the diaphragm 12 in the second direction are provided at different positions from each other, the facing portion P1 in which the adjacent electrodes face each other with a piezoelectric layer 27 interposed between the electrodes in the piezoelectric vibration element 14, in the case of the piezoelectric vibration device 15 according to this example. With this, it is possible to further distribute the standing wave which is generated in the second direction of the diaphragm 12, and to further reduce rapid amplitude change at a specific frequency.

Furthermore, when the center C1 of the facing portion P1 in the second direction is far from the center C3 of the diaphragm 12 in the second direction, the effect of reducing the peak level which is generated at a specific frequency is improved, but intensity of the vibration generated decreases overall in the vibration characteristic of the diaphragm 12. Accordingly, a distance between the center C1 of the facing portion P1 in the second direction and the center C3 of the diaphragm 12 in the second direction is appropriately set according to a desired characteristic.

Third Example According to the Embodiment

Figure 7:
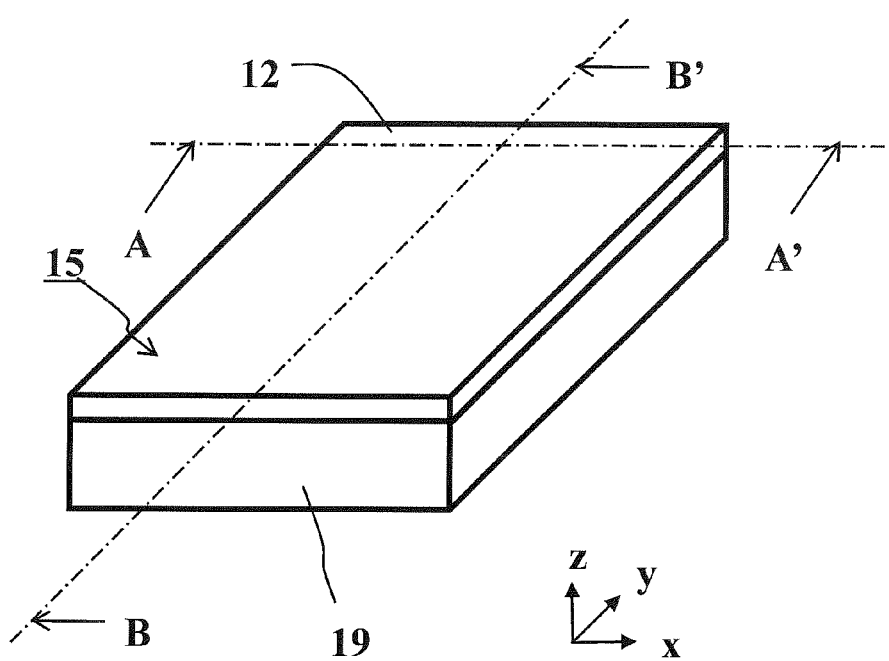
FIG. 7 is a perspective view schematically illustrating a portable terminal as a third example according to an embodiment of the invention.
Figure 8:
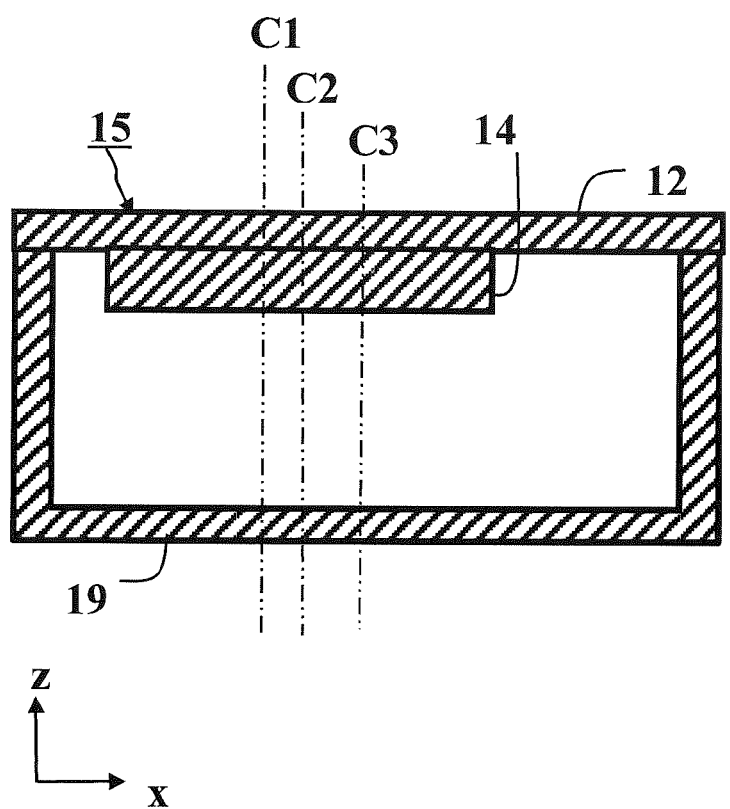
FIG. 8 is a cross-sectional view taken along line A-A' in FIG. 7.
Figure 9:
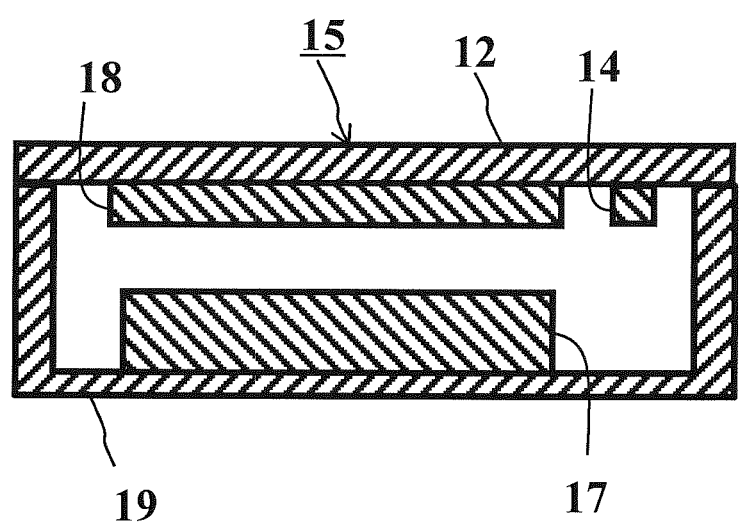
FIG. 9 is a cross-sectional view taken along line B-B' in FIG. 7.
Figure 9:
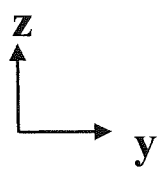

FIG. 7 is a perspective view schematically illustrating a portable terminal as a third example according to an embodiment of the invention. FIG. 8 is a cross-sectional view taken along line A-A' in FIG. 7. FIG. 9 is a cross-sectional view taken along line B-B' in FIG. 7. The detailed structure of the piezoelectric vibration element 14 is not illustrated in FIGS. 8 and 9. This example will be described below focusing on the difference from the above-described second example according to the embodiment, the same components are denoted by the same reference signs, and repetitive description thereof will be omitted. The portable terminal of this example includes the piezoelectric vibration device 15 of the second example shown in FIGS. 5 and 6 according to the embodiment, an electronic circuit 17, a display 18 and a housing 19.

The electronic circuit 17 generates an electric signal which is input to the piezoelectric vibration element 14. The electronic circuit 17 may include other circuits such as a circuit for processing image information displayed on the display 18, a communication circuit, or the like. The electronic circuit 17 and the piezoelectric vibration element 14 are connected by a wiring (not illustrated).

The display 18 is a display device having a function of displaying image information, and for example, known displays such as a liquid crystal display, a plasma display, and an organic EL display may be appropriately used as the display 18. The display 18 may have an input device such as a touch panel.

The housing 19 has a box-shape in which one surface is opened. The housing 19 may be formed by using various known materials. For example, the housing 19 may be formed by appropriately using materials such as synthetic resin, which have high rigidity and elasticity, but may also be formed by using other materials such as metal.

The piezoelectric vibration device 15 is provided at an opening portion of the housing 19 in the portable terminal of this example. The diaphragm 12 is disposed outside of the display 18 to be integrally formed with the display 18, and functions as a cover for protecting the display 18. Only the circumference of one main surface (main surface on the −z direction side in the drawing) is bonded to the housing 19 in the diaphragm 12, and the diaphragm 12 is attached to the housing 19 so as to allow for vibration. The housing 19 and the diaphragm 12 may be bonded using various known bonding members such as adhesive and a double-sided tape. The diaphragm 12 may also have an input device like a touch panel.

The diaphragm 12 can be vibrated to generate sound by vibrating the piezoelectric vibration element 14 in the portable terminal with the above configuration. The generated sound can allow sound information to be transmitted to a person. The diaphragm 12 or the housing 19 comes into contact with a part of the human body, such as an ear directly or through other objects, and the vibration is transmitted, thereby making the sound information to be transmitted possible.

Since the sound information is transmitted by using the piezoelectric vibration device 15 in which rapid amplitude change is reduced at a specific frequency, the portable terminal of this example can be obtained which can transmit the sound information with small distortion and high quality.

Modification Example

The invention is not limited to an example of the above-described embodiment, various enhancements and changes may be made without departing from the gist of the invention.

For example, the first example described above according to the embodiment is illustrated in which the piezoelectric vibration element 14 has 16 pieces of the piezoelectric layers 27, but is not limited thereto. The number of the piezoelectric layers 27 may be more or less than 16.

The second and third examples described above according to the embodiment are illustrated in which the piezoelectric vibration element 14 of the first example according to the embodiment is provided, but are not limited thereto, and a piezoelectric vibration element with another form may also be provided.

The portable terminal illustrated in the third example described above according to the embodiment is illustrated in which the vibration of the diaphragm 12 allows the sound information to be transmitted, but it is not limited thereto. For example, a portable terminal may be provided in which the diaphragm 12 is vibrated to transmit the vibration to the finger of a person when the finger comes into contact with the diaphragm 12, and it is clearly notified that the finger comes into contact with the diaphragm 12.

The third example described above according to the embodiment is illustrated in which a cover of the display 18 functions as the diaphragm 12, but is not limited thereto. For example, the display 18 as itself may also function as the diaphragm 12.

Examples

A specific example of the piezoelectric vibration device according to the invention will be described below. Measurement of the characteristic was performed in the piezoelectric vibration device of the second example shown in FIGS. 5 and 6 according to the embodiment of the invention.

The diaphragm 12 used a glass plate which is 104 mm in length, 59 mm in width, and 0.7 mm in thickness. The circumference of the main surface of the glass on the other side of the first direction (−z direction side in the drawing) was adhesively fixed to an aluminum frame with a width of 4 mm. A double-sided tape with a thickness of 0.15 mm was used for adhering. The piezoelectric vibration element 14 had a rectangular parallelepiped shape which is 23.5 mm in length, 3.3 mm in width, and 0.5 mm in thickness. The piezoelectric vibration element 14 had a structure in which the piezoelectric layers 27 with a thickness of approximately 30 μm and the internal electrodes 21 to 25 were alternately laminated, and the total number of the piezoelectric layers 27 was 16. The facing portion P1 was a portion in which adjacent electrodes faced each other with the piezoelectric layers 27 interposed therebetween in the piezoelectric vibration element 14, and the center C1 of the facing portion P1 in the second direction (x axis direction in the drawing) and the center C2 of the piezoelectric vibration element 14 in the second direction had a difference of 0.4 mm. The piezoelectric layers 27 were formed of lead zirconate titanate (PZT) in which a part of zircon is substituted with stibium. A double-sided tape with a thickness of 0.16 mm was used for adhesion of the diaphragm 12 and the piezoelectric vibration element 14, in which acrylic adhesive was applied on both sides of a nonwoven fabric base member. The entire surface of the vibration element 14 on one side of the first direction (+z direction side in the drawing) was attached to the diaphragm 12. The center C1 of the facing portion P1 of the piezoelectric vibration element 14 in the second direction (x axis direction in the drawing) and the center C3 of the diaphragm 12 in the second direction had a difference of 10.8 mm.

Figure 10:
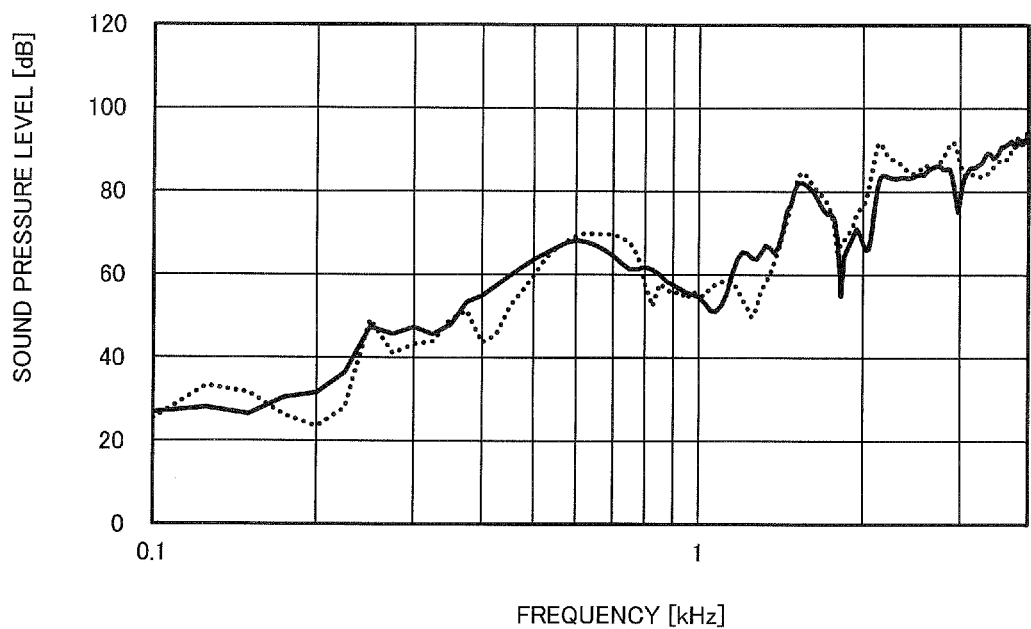
FIG. 10 is a graph showing frequency dependence on sound pressure in the piezoelectric vibration device as the second example according to an embodiment of the invention and in a piezoelectric vibration device in a comparative example.

Then, evaluation of frequency dependence was performed with respect to sound pressure of sound generated by the manufactured piezoelectric vibration device. In evaluation, a microphone was disposed at a distance of 10 mm from the surface of the diaphragm 12 on one side of the first direction (+z direction side in the drawing). A sinusoidal wave signal with an effective value of 10.6 V was input to the vibration element 14, and then the sound pressure detected by the microphone was evaluated. The evaluation result is indicated by a solid line in the graph of FIG. 10. The facing portion is a portion in which adjacent electrodes face each other with the piezoelectric layers interposed therebetween, and the evaluation result in the piezoelectric vibration device of a comparative example is indicated by a dot line in the graph of FIG. 10, the comparative example in which the center of the facing portion, the center of the piezoelectric vibration element and the center of the diaphragm are all matched. A horizontal axis indicates frequency, and a vertical axis indicates sound pressure in the graph of FIG. 10. According to the graph shown in FIG. 10, a rapid change at sound pressure according to a change at frequency is reduced, and a particularly smooth and good sound pressure characteristic at a low frequency is obtained in the piezoelectric vibration device of the invention, compared to the piezoelectric vibration device in the comparative example. With this, effectiveness of the invention can be confirmed.

REFERENCE SIGNS LIST

12 diaphragm
14 piezoelectric vibration element
15 piezoelectric vibration device
17 electronic circuit
21, 22, 23, 24, 25 electrode
27 piezoelectric layer
P1 facing portion
C1 center of facing portion in second direction
C2 center of piezoelectric vibration element in second direction
C3 center of diaphragm in second direction

The invention claimed is:

1. A piezoelectric vibration element which includes at least a plurality of electrodes and a plurality of piezoelectric layers alternately disposed in a first direction, and performs bending vibration in the first direction,
    wherein the piezoelectric vibration element has a form elongated in a second direction vertical to the first direction,
    each of the electrodes has an elongated shape in the second direction,
    a center of a facing portion in the second direction is provided at a different position from a center of the piezoelectric vibration element in the second direction,
    the facing portion is a portion in which the electrodes that are disposed adjacent to each other in the first direction and have different electric potentials face each other by having each of the piezoelectric layers therebetween.

2. A piezoelectric vibration device which includes at least a piezoelectric vibration element according to claim 1 and a diaphragm bonded to a surface of the piezoelectric vibration element on one side of the first direction,
    wherein the center of the facing portion in the second direction is provided at a different position from a center of the diaphragm in the second direction.

3. The piezoelectric vibration device according to claim 2,
    wherein the center of the facing portion in the second direction, the center of the piezoelectric vibration element in the second direction, and the center of the diaphragm in the second direction are provided at different positions from one another.

4. A portable terminal which includes at least
    a housing,
    the piezoelectric vibration device according to claim 2 which is provided in the housing, and
    an electronic circuit which generates an electric signal to be received by the piezoelectric vibration element.

5. A piezoelectric vibration element comprising:
    a plurality of electrodes; and
    a plurality of piezoelectric layers,
    wherein the plurality of electrodes and the plurality of piezoelectric layers are alternately disposed in a first direction, and
    the piezoelectric vibration element performs bending vibration in the first direction, and
    the piezoelectric vibration element has a form elongated in a second direction vertical to the first direction, and
    each of the electrodes has an elongated shape in the second direction, and
    the piezoelectric vibration element has a facing portion in which two of the plurality of electrodes that are disposed adjacent to each other in the first direction and have different electric potentials face each other by having one of the plurality of piezoelectric layers therebetween, and
    a center of the facing portion in the second direction is provided at a different position from a center of the piezoelectric vibration element in the second direction.

6. A piezoelectric vibration device which includes at least a piezoelectric vibration element according to claim 5 and a diaphragm bonded to a surface of the piezoelectric vibration element on one side of the first direction,
    wherein the center of the facing portion in the second direction is provided at a different position from a center of the diaphragm in the second direction.

7. The piezoelectric vibration device according to claim 6,
    wherein the center of the facing portion in the second direction, the center of the piezoelectric vibration element in the second direction, and the center of the diaphragm in the second direction are provided at different positions from one another.

8. A portable terminal which includes at least
a housing,
the piezoelectric vibration device according to claim 6 which is provided in the housing, and
an electronic circuit which generates an electric signal to be received by the piezoelectric vibration element.

9. A piezoelectric vibration element comprising:
a plurality of electrodes; and
a plurality of piezoelectric layers,
wherein the plurality of electrodes and the plurality of piezoelectric layers are alternately disposed in a first direction, and
the piezoelectric vibration element has a form elongated in a second direction vertical to the first direction, and
each of the electrodes has an elongated shape in the second direction, and
the piezoelectric vibration element performs bending vibration by inputting an electric signal, and
the piezoelectric vibration element has a facing portion in which two of the plurality of electrodes that are disposed adjacent to each other in the first direction and have different electric potentials overlap each other in the first direction, and
a center of the facing portion in the second direction is provided at a different position from a center of the piezoelectric vibration element in the second direction.

10. A piezoelectric vibration device which includes at least a piezoelectric vibration element according to claim 9 and a diaphragm bonded to a surface of the piezoelectric vibration element on one side of the first direction,
wherein the center of the facing portion in the second direction is provided at a different position from a center of the diaphragm in the second direction.

11. The piezoelectric vibration device according to claim 10,
wherein the center of the facing portion in the second direction, the center of the piezoelectric vibration element in the second direction, and the center of the diaphragm in the second direction are provided at different positions from one another.

12. A portable terminal which includes at least
a housing,
the piezoelectric vibration device according to claim 10 which is provided in the housing, and
an electronic circuit which generates an electric signal to be received by the piezoelectric vibration element.

* * * * *